US010509312B2

(12) United States Patent
Liu et al.

(10) Patent No.: US 10,509,312 B2
(45) Date of Patent: Dec. 17, 2019

(54) APPROACH FOR ULTRA THIN-FILM TRANSFER AND HANDLING

(71) Applicant: Taiwan Semiconductor Manufacturing Co., Ltd., Hsin-Chu (TW)

(72) Inventors: Ping-Yin Liu, Yonghe (TW); Chang-Ming Wu, New Taipei (TW); Chia-Shiung Tsai, Hsin-Chu (TW); Xin-Hua Huang, Xihu Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/013,163

(22) Filed: Jun. 20, 2018

(65) Prior Publication Data

US 2019/0094682 A1 Mar. 28, 2019

Related U.S. Application Data

(60) Provisional application No. 62/563,222, filed on Sep. 26, 2017.

(51) Int. Cl.
*G03F 7/20* (2006.01)
*G03F 1/64* (2012.01)

(52) U.S. Cl.
CPC .............. *G03F 1/64* (2013.01); *G03F 7/7015* (2013.01)

(58) Field of Classification Search
CPC ...... G03F 1/62; G03F 1/22; G03F 1/24; G03F 7/70983; G03F 1/82; G03F 1/84; G03F 1/48; G03F 1/54; G03F 7/20; G03F 7/70916; G03F 1/72; G03F 1/142; G03F 1/14; H01L 21/67359
See application file for complete search history.

(56) References Cited

U.S. PATENT DOCUMENTS

2009/0274962 A1* 11/2009 Kubota .................. B82Y 10/00
430/5
2017/0082920 A1* 3/2017 Tseng ........................ G03F 1/64

* cited by examiner

*Primary Examiner* — Mesfin T Asfaw
(74) *Attorney, Agent, or Firm* — Eschweiler & Potashnik, LLC

(57) ABSTRACT

A method for forming a pellicle apparatus involves forming a device substrate by depositing one or more pellicle layers defined over a base device layer, where a release layer is formed thereover. An adhesive layer is formed over a transparent carrier substrate. The adhesive layer is bonded to the release layer, defining a composite substrate comprised of the device and carrier substrates. The base device layer is removed from the composite structure and a pellicle frame is attached to an outermost one of the pellicle layers. A pellicle region is isolated from a remainder of the composite structure, and an ablation of the release layer is performed through the transparent carrier substrate, defining the pellicle apparatus comprising a pellicle film attached to the pellicle frame. The pellicle apparatus is then from a remaining portion of the composite substrate.

18 Claims, 8 Drawing Sheets

APPROACH FOR ULTRA THIN-FILM TRANSFER AND HANDLING

REFERENCE TO RELATED APPLICATION

This Application claims priority to U.S. Provisional Application No. 62/563,222 filed on Sep. 26, 2017, the contents of which are hereby incorporated by reference in their entirety.

BACKGROUND

Extreme ultraviolet lithography (EUVL) is a promising next-generation lithography solution for emerging technology nodes. Integrated chips formed using EUVL will have minimum feature sizes of less than 32 nanometers. Such small feature sizes allow contaminants (e.g., dust, airborne microbes, chemical vapors, etc.) to damage integrated chips during fabrication. To prevent such contaminants from damaging integrated chips, integrated chips are fabricated in clean rooms having low levels of contaminants.

However, even the best clean rooms still contain contaminants that can fall on a lithography reticle and cause defects. To prevent such contamination of a reticle, many lithography systems use pellicles. Pellicles are optically transmitting thin films (i.e., membranes) that are disposed over a reticle to provide protection from the effects of particulate contamination by preventing contaminant particles from landing on a reticle.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
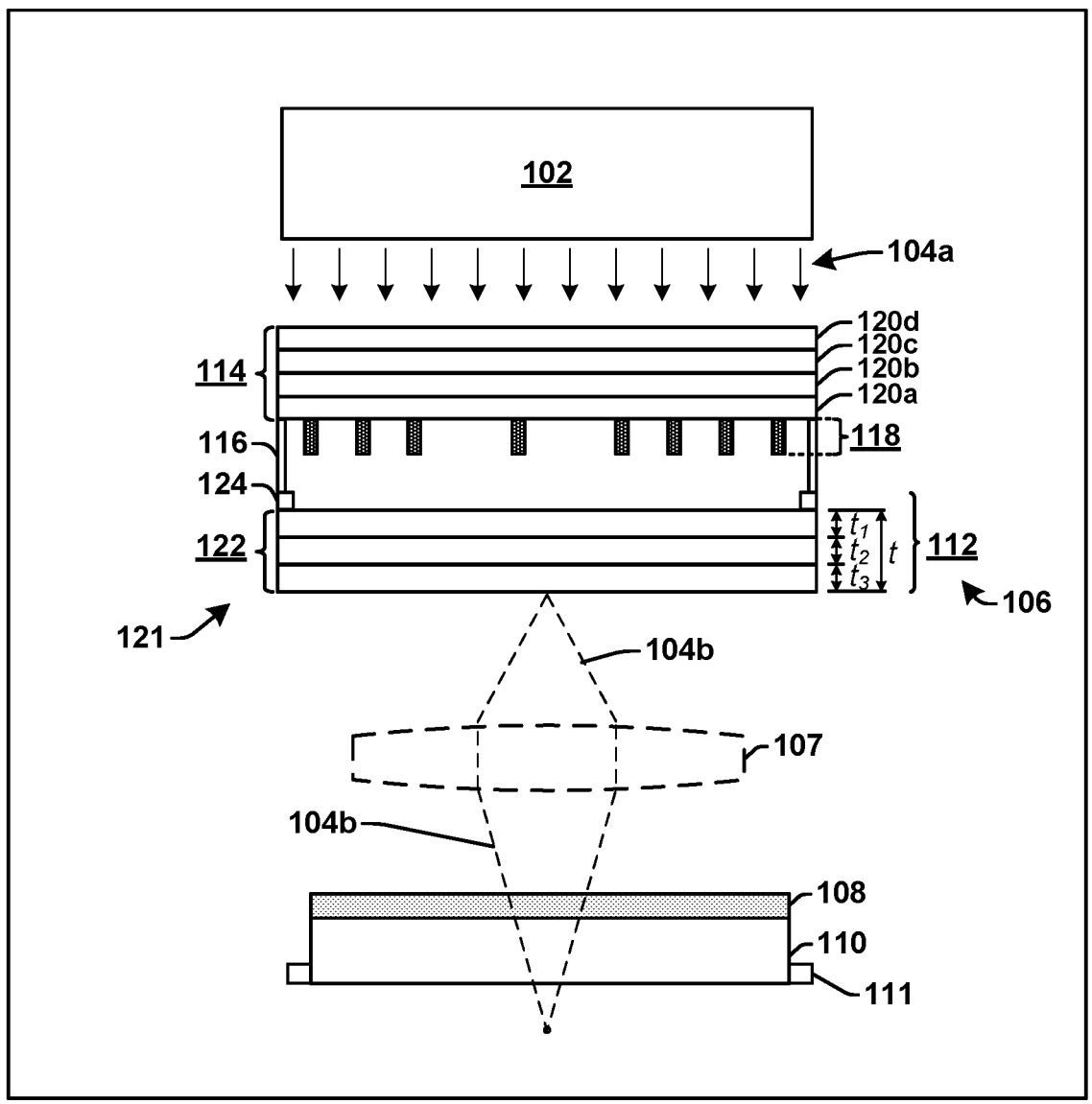
FIG. 1 illustrates a block diagram of some embodiments of an extreme ultraviolet lithography (EUVL) system according to some embodiments of the disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor processing, a photomask can be protected from falling particles during exposure by a pellicle, which in one example, is a thin transparent film stretched over a frame that is glued over one side of the photomask. The pellicle, for example, is far enough away from the mask patterns so that moderate-to-small sized particles that land on the pellicle will be too far out of focus to print. Although they are designed to keep particles away, pellicles become a part of the imaging system and their optical properties can vary for differing transmission wavelengths.

Extreme ultraviolet radiation (i.e., radiation having wavelengths between 124 nm and 10 nm), also called "EUV", is among the most highly absorptive radiation of the electromagnetic spectrum. Particle contamination can be a significant problem in semiconductor manufacturing using extreme ultraviolet lithography. Due to the high absorption of extreme ultraviolet radiation, pellicles used in extreme ultraviolet lithography (EUVL) systems are typically very thin, slack-free films having a constant tension that allow for a high rate of optical transmission.

To successfully implement thin films that have a constant tension, a selected film may be supported by a support structure that extends over an extreme ultraviolet reticle. The support structure used to support a thin film may comprise a mesh structure, having a plurality of hexagon or square openings (e.g., a honeycomb structure) that allow for transmission of extreme ultraviolet radiation. However, it has been appreciated that due to the high absorption of extreme ultraviolet radiation, the mesh of a support structure may also block extreme ultraviolet radiation and cause substantial non-uniformities in the intensity of extreme ultraviolet radiation incident on an extreme ultraviolet reticle.

In some instances, the support structure may comprise a pellicle frame surrounding a thin pellicle film, whereby the frame is mounted to a previously-formed thin pellicle film. Handling of the thin pellicle film while mounting the frame thereto, however, can be difficult, whereby maintaining adequate tension across the thin pellicle film and adequate mounting of the frame to the thin pellicle film has been troublesome. Other methods for forming a pellicle have included direct separation techniques, whereby a frame is attached to a thin pellicle film using a layer of a polymer. However, removal of said polymer from the thin pellicle film in areas of exposure of the EUV radiation has also been troublesome. Still other methods include providing a silicon frame, whereby the silicon frame is formed using traditional semiconductor processing techniques. However, such silicon frames have had difficulty in mounting to the thin pellicle film.

Accordingly, the present disclosure relates to a method of forming an EUV pellicle comprising an high quality, optically transmissive pellicle film connected to a pellicle frame without a supportive mesh, and an associated EUV system and pellicle apparatus. The present disclosure provides a novel approach for ultra-thin film transfer and handling through wafer-level bonding, backside engineering, and laser stripping.

In some embodiments, the method is performed by providing a device substrate having one or more pellicle layers defined over a base device layer, whereby a release layer is formed over the one or more pellicle layers. A transparent carrier substrate is further provided, wherein an adhesive layer is formed over the transparent carrier substrate, and wherein the adhesive layer is bonded to the release layer, therein defining a composite substrate comprised of the device substrate and carrier substrate. The base device layer is removed from the composite structure, and a pellicle frame is attached to an outermost one of the one or more pellicle layers. The pellicle region is physically isolated from a remainder of the composite structure, wherein the pellicle region is associated with an outer perimeter of the pellicle frame. In accordance with the present disclosure, an ablation of the release layer is performed through the transparent carrier substrate, therein defining the pellicle apparatus comprising a pellicle film attached to the pellicle frame, wherein the pellicle apparatus is separated from a remaining portion of the composite substrate.

FIG. 1 illustrates a block diagram of some embodiments of an extreme ultraviolet lithography (EUVL) system 100. In accordance with several exemplary aspects, the extreme ultraviolet lithography system 100 comprises an extreme ultraviolet source 102 (alternatively called a radiation source) configured to emit extreme ultraviolet (EUV) radiation 104 (e.g., emitted radiation having wavelengths in a range of about 10 nm to about 130 nm). The emitted extreme ultraviolet radiation 104 is supplied as incident extreme ultraviolet radiation 104a to a patterning element 106. The patterning element 106 is configured to transmit the incident extreme ultraviolet radiation 104a, as transmitted extreme ultraviolet radiation 104b, to one or more optical elements 107. The one or more optical elements 107 are configured to focus the transmitted extreme ultraviolet radiation 104b in a manner that selectively patterns a light sensitive photoresist material 108 disposed over target substrate 110, such as a semiconductor workpiece.

The target substrate 110, for example may comprise any substrate undergoing extreme ultraviolet exposure in a lithographic process. In one example embodiment of the present disclosure, the target substrate 110 is supported on a target apparatus 111, such as a table, clamp, frame, or any other apparatus configured to support the target substrate.

In accordance with one aspect of the disclosure, the patterning element 106 comprises an extreme ultraviolet pellicle 112 (e.g., an extreme ultraviolet pellicle apparatus), which is mounted over an extreme ultraviolet reticle 114 (e.g., a lithographic reticle) by way of a pellicle frame 116. In one example, the extreme ultraviolet reticle 114 comprises a pattern 118 and one or more layers 120a, 120b, 120c, 120d. It is noted that the patterning element 106 illustrated in FIG. 1 of the present disclosure transmits the incident extreme ultraviolet radiation 104a (e.g., at 13.5 nm) therethough. The patterning element 106 may be accordingly modified to be utilized in other photolithographic processing, such as reflective photolithography. Accordingly, the target apparatus 111 is configured to support the target substrate 110, wherein the extreme ultraviolet radiation source 102, extreme ultraviolet reticle 114, and target apparatus 111 are arranged such that the extreme ultraviolet radiation source 102 is configured to expose the target substrate with an image (not shown) associated with the pattern 118 on the extreme ultraviolet reticle.

According to one example, the one or more layers 120a, 120b, 120c, 120d may comprise any number of reflective layers, transparent layers, and spacer layers. In some embodiments, the reflective layers may comprise molybdenum (Mo) or ruthenium (Ru) and the spacer layers may comprise silicon (Si). The reflective layers, for example, are configured to reflect incident extreme ultraviolet radiation 104a by means of Bragg interference between multi-interlayer interference formed between the reflective and spacer layers, respectively. For example, a ray of incident extreme ultraviolet radiation 104a may be partially reflected at a first interlayer interface formed between a first reflective layer 120a and a first spacer layer 120b and partially reflected at a second interlayer interface formed between a second reflective layer 120c and a second spacer layer 120d.

In accordance with several embodiments of the present disclosure, the extreme ultraviolet pellicle 112 (also called a pellicle apparatus) comprises a pellicle film 121 comprising a substrate element 122 (e.g., a composite structure or a thin substrate), which is connected to the pellicle frame 116 by way of an adhesive material 124. When viewed from above, the pellicle frame 116, in one embodiment, is generally circular. However, other shapes of the pellicle frame 116 are also contemplated, such as ovular, rectangular, or any other suitable shape. The adhesive material 124 may be disposed between the substrate element 122 and the pellicle frame 116 along outer edges of the pellicle frame, so that the adhesive material 124 does not interfere with the incident extreme ultraviolet radiation 104a or transmitted extreme ultraviolet radiation 104b. The substrate element 122, for example, is configured to prevent contaminant particles from landing on the extreme ultraviolet reticle 114 and degrading the extreme ultraviolet lithography system 100 (e.g., by keeping contaminant particles away from a plane of focus of the extreme ultraviolet reticle 114).

The substrate element 122, in accordance with one example, comprises an unbroken film having a substantially uniform thickness t between the adhesive material 124. In some embodiments, the substrate element 122 may have a thickness t of less than approximately 50 nm (500 Angstroms). The substrate element 122 of the present disclosure provides for a high quality pellicle film or membrane that is able to be attached to the pellicle frame 116 without using a support structure that may interfere with the incident or transmitted extreme ultraviolet radiation, 104a or 104b.

Figure 2:
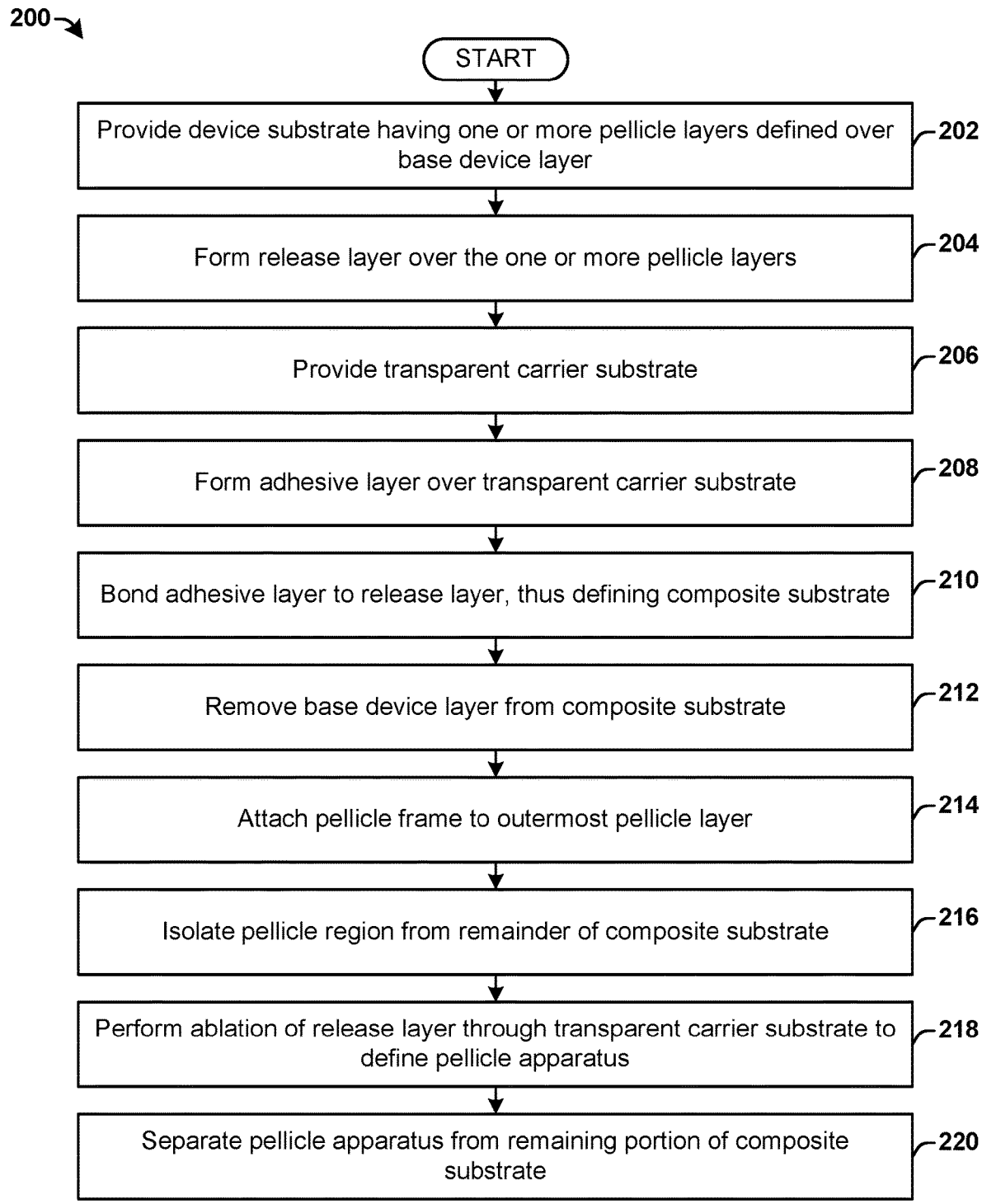
FIG. 2 illustrates a flow diagram of some embodiments of a method for forming a pellicle according to the present disclosure.

FIG. 2 is a flow diagram of some exemplary embodiments of a method 200 of forming a pellicle for an extreme ultraviolet (EUV) reticle. The present method 200 provides an ultra-thin film (e.g., less than 500 Angstroms), whereby no extra silicon frame is needed to enhance mechanical strength, as seen in conventional pellicle technologies.

While the disclosed methods (e.g., method 200) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 202 of FIG. 2, for example, a device substrate is provided, wherein the device substrate comprises one or more pellicle layers, and wherein the one or more pellicle layers are defined over a base device layer. In some embodiments, the base device layer may comprise a silicon substrate of mono-crystalline silicon. In other embodiments, the base device layer may comprise another material such as a material having a carbon base (e.g., graphene). In one example of the present disclosure, the one or more pellicle layers comprise one or more of a silicon nitride (SiN) layer, a polysilicon layer, and a ruthenium layer. For example, the silicon nitride layer may be formed on the base device layer, the polysilicon layer may be formed on the silicon nitride layer, and the ruthenium layer may be formed on the polysilicon layer. The one or more pellicle layers, may be considered an "ultra-thin film", whereby the one or more pellicle layers, in accordance with one embodiment, are deposited over the base device layer by chemical vapor deposition (CVD). The one or more pellicle layers of the ultra-thin film, for example, meet the requirements associated with extreme ultraviolet (13.5 nm) processing technologies.

At act 204, a release layer is formed over the one or more pellicle layers. In an exemplary embodiment, the release layer comprises a laser release layer or an adhesive. The release layer, for example, is sensitive to a predetermined wavelength of light, such as infrared (IR) or ultraviolet (UV) light. In one example, the release layer is configured to decompose (e.g., melt, vaporize, etc.) when the release layer absorbs the predetermined wavelength of light. The release layer formed in act 204, for example, may be deposited or otherwise formed over the one or more pellicle layers. In one example, the release layer comprises a laser release layer that is less than 50 nm in thickness.

At act 206, a transparent carrier substrate is provided. The transparent carrier substrate that is provided in act 206, for example, comprises a material having a high optical transmission rate. In one example, the transparent carrier substrate comprises a glass substrate. In some embodiments of the present disclosure, the carrier substrate is less than approximately 250 microns in thickness. Further, in some examples, the carrier substrate comprises a material having greater than 90% transmittance in wavelengths ranging from 100 nm to 500 nm.

At act 208, an adhesive layer is formed over the transparent carrier substrate. The adhesive layer formed in act 206, for example, may be deposited or otherwise formed over the transparent carrier substrate. The adhesive layer formed in act 206, for example, may comprise a polymer such as a thermoplastic or a thermoset synthetic material. In one example embodiment, the adhesive layer is a coating having a thickness greater than a 1 micron over the transparent carrier substrate.

At act 210, the adhesive layer on the transparent carrier substrate is bonded to the release layer on the device substrate. The transparent carrier substrate and device substrate, for example, thus jointly define a composite substrate wherein the one or more pellicle layers, release layer, and adhesive layer are sandwiched between the base device layer and the transparent carrier substrate. In one example, the bonding of the adhesive layer on the transparent carrier substrate to the release layer on the device substrate is performed with a force of less than 50 KN, a dwell temperature ranging between 50 C and 400 C, and a dwell time (e.g., a process time) of less than 60 hours.

At act 212, the base device layer is removed from the composite substrate. For example, in accordance with one embodiment of the present disclosure, the base device layer is removed from the composite substrate by one or more of an etching operation, such as a wet etch and dry etch, and a grinding operation. Other methods for removing the base device layer from the composite substrate are also contemplated, such as a reactive ion etching or other removal techniques.

At act 214, a pellicle frame is attached to an outermost surface of the one or more pellicle layers.

At act 216, a pellicle region of the composite structure is isolated from a remainder of the composite substrate. In accordance with one example, the pellicle region is associated with an outer perimeter of the pellicle frame. Isolating the pellicle region of the composite structure from a remainder of the composite substrate in act 216, for example, may be accomplished by one or more of a mechanical dicing of the composite substrate and laser dicing of the composite substrate.

At act 218, an ablation of the release layer is performed through the transparent carrier substrate. The ablation of the release layer performed in act 218, for example, generally defines a pellicle apparatus comprising a pellicle film (e.g., the ultra-thin film) attached to the pellicle frame. The ablation of the release layer performed in act 218, for example, may comprise a laser ablation, whereby the laser ablation decomposes the release layer formed in act 204. The laser ablation, for example, may be advantageously performed to minimize thermal effects during said ablation, whereby the release layer decomposes under 100 nm to 500 nm in laser wavelength.

At act 220, the pellicle apparatus is removed from a remaining portion of the composite substrate. Once removed from the remaining portion of the composite substrate, the pellicle apparatus can be incorporated into an extreme ultraviolet lithography system.

FIGS. 3-13 illustrate cross-sectional views corresponding to some embodiments of an exemplary method of forming a pellicle for an extreme ultraviolet pellicle. It will be appreciated that although FIGS. 3-13 are described with respect to a method 200, the illustrated cross-sectional views are not limited such a method.

Figure 3:
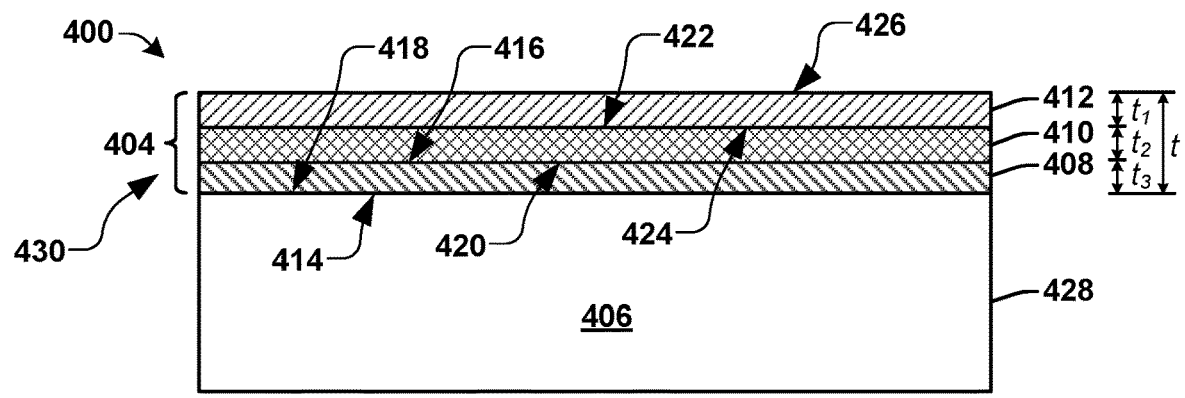
FIGS. 3-13 illustrate various cross-sectional views of a pellicle formation according to some embodiments of the present disclosure.

FIG. 3 illustrates a cross-sectional view 400 of some embodiments of a device substrate 402 corresponding to act 202 of FIG. 2. As shown in the cross-sectional view 400 of FIG. 3, one or more pellicle layers 404 are formed or otherwise provided over base device layer 406. In accordance with one example embodiment, the one or more pellicle layers 404 comprise a first pellicle layer 408 having a first thickness $t_1$, a second pellicle layer 410 having a second thickness $t_2$, and a third pellicle layer 412 having a third thickness $t_3$.

The one or more pellicle layers 404, for example, can be considered the substrate element 122 of FIG. 1, wherein, as stated above, the thickness t of the substrate element can have a thickness of less than approximately 500 Angstroms. According to one example embodiment of the present disclosure, the one or more pellicle layers 404 of FIG. 3 are formed or otherwise provided over base device layer 406, wherein the first thickness $t_1$ of the first pellicle layer 408 may be less than or equal to approximately 80 Angstroms. In another example embodiment, the second thickness $t_2$ of the second pellicle layer 410 may be less than or equal to approximately 200 Angstroms. In yet another example embodiment, the third thickness $t_3$ of the third pellicle layer 412 may also be less than or equal to approximately 200 Angstroms. It should be noted that, while specific values and/or ranges of values for the first thickness $t_1$ of the first pellicle layer 408, the second thickness $t_2$ of the second pellicle layer 410, and the third thickness $t_3$ of the third pellicle layer 412, as well as the cumulative thickness t of the substrate element 122 of FIG. 1 are recited, such values are not limiting, and variations in the values and ranges beyond the presented values and ranges are further contemplated by the present disclosure.

The first pellicle layer 408, for example, has a first surface 414 and a second surface 416 opposing the first surface, wherein the first surface interfaces with a base surface 418 of the base device layer 406. The second pellicle layer 410, for example, has a third surface 420 and a fourth surface 422 opposing the third surface 420, wherein the third surface 420 interfaces with the second surface 416 of the first pellicle layer 408. The third pellicle layer 412, for example, has a fifth surface 424 and a sixth surface 426, wherein the fifth surface 424 interfaces with the fourth surface 422 of the second pellicle layer 410.

In accordance with an embodiment of the present disclosure, the base device layer 406 comprises a silicon substrate 428. The first pellicle layer 408, for example, comprises silicon nitride (SiN), the second pellicle layer 410 comprises polysilicon, and the third pellicle layer 412 comprises ruthenium, although other materials may be selected based on desired characteristics. Ruthenium, for example, provides a high transmission in the extreme ultra violet wavelength range while providing high resistance toward corrosive conditions. The one or more pellicle layers 404 thus define an ultra-thin film 430 (e.g., comprising the first pellicle layer 408, second pellicle layer 410, and third pellicle layer 412 in the present example), whereby the ultra-thin 430 film has a total thickness t. In one example, the first thickness $t_1$ of the first pellicle layer 408 is approximately 200 Angstroms (20 nm) or less, the second thickness $t_2$ of the second pellicle layer 410 is approximately 200 Angstroms (20 nm) or less, and the third thickness $t_3$ of the third pellicle layer 412 is approximately 80 Angstroms (8 nm) or less, whereby the total thickness t to the ultra-thin film 430 is less than approximately 500 Angstroms (50 nm).

The provision of the device substrate 402 in act 202 of FIG. 2 may formed the ultra-thin film 430 during previous processing by a variety of techniques, such as chemical vapor deposition or other thin-film formation processes.

Figure 4:
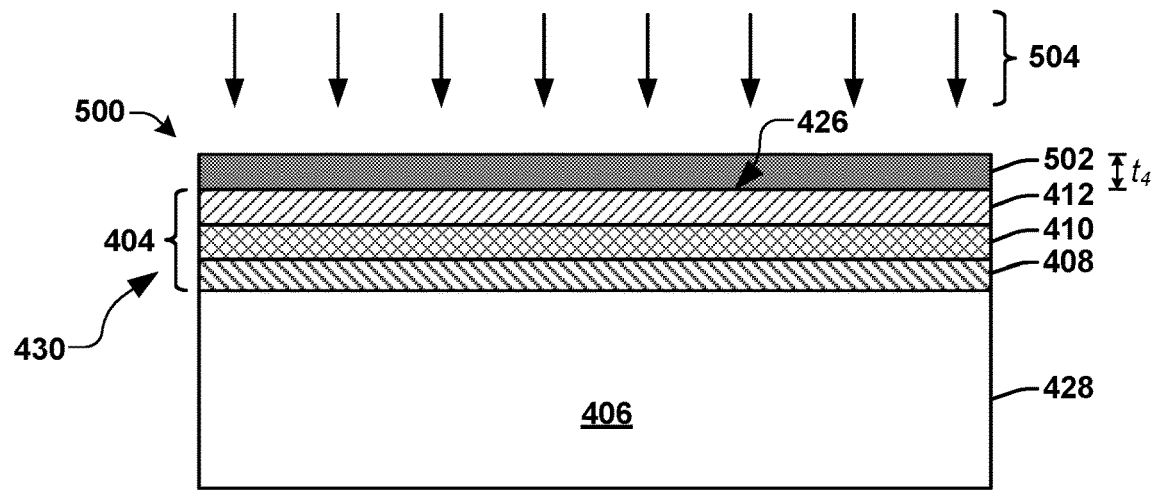

FIG. 4 illustrates a cross-sectional view 500 of some embodiments of the device substrate 402 corresponding to act 204 of FIG. 2. As shown in the cross-sectional view 500 of FIG. 4, a release layer 502 is formed (e.g., via CVD shown by arrows 504) over the third pellicle layer 412. For example, the release layer 502 is formed on the sixth surface 426 and has a fourth thickness $t_4$. The fourth thickness $t_4$ of the release layer 502, for example, is approximately 500 Angstroms (50 nm) or less and may comprise a laser release layer comprised of a material (e.g., an adhesive) that is sensitive to a predetermined wavelength of light (e.g., infrared or ultraviolet light), whereby the material is decomposed (e.g., melted, vaporized, etc.) when the material absorbs the light. For example, laser ablation of the release layer 502 at one or more predetermined wavelengths, such as between 100 nm and 500 nm, may be utilized to minimize thermal effects on the device substrate 402.

Figure 5:
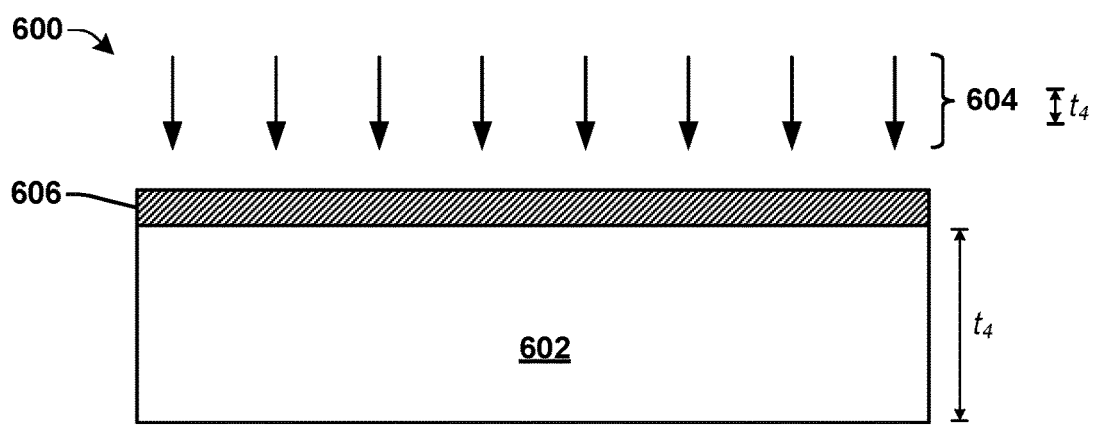

FIG. 5 illustrates a cross-sectional view 600 of some embodiments of the provision of a transparent carrier substrate 602 corresponding to act 206 of FIG. 2. As shown in the cross-sectional view 600 of FIG. 6, the transparent carrier substrate 602 comprises a material having a high optical transmission rate. In one example, the transparent carrier substrate comprises a transparent material such as one or more of glass, fused silica, quartz, or other transparent material. In some embodiments of the present disclosure, the transparent carrier substrate 602 has a fifth thickness $t_5$ of less than approximately 250 microns in thickness. Further, in some examples, the carrier substrate comprises a material having greater than 90% transmittance in wavelengths ranging from 100 nm to 500 nm.

FIG. 5 further illustrates a formation process (e.g., illustrated by arrows 604) of an adhesive layer 606 over the transparent carrier substrate 602 corresponding to act 208 of FIG. 2. The adhesive layer 606, for example, may be formed by a spin-on process or other process, whereby the adhesive layer 606 is formed, deposited, or applied over the transparent carrier substrate 602. The adhesive layer 606, for example, is formed onto a top surface 608 of the transparent carrier substrate 602.

Figure 6:
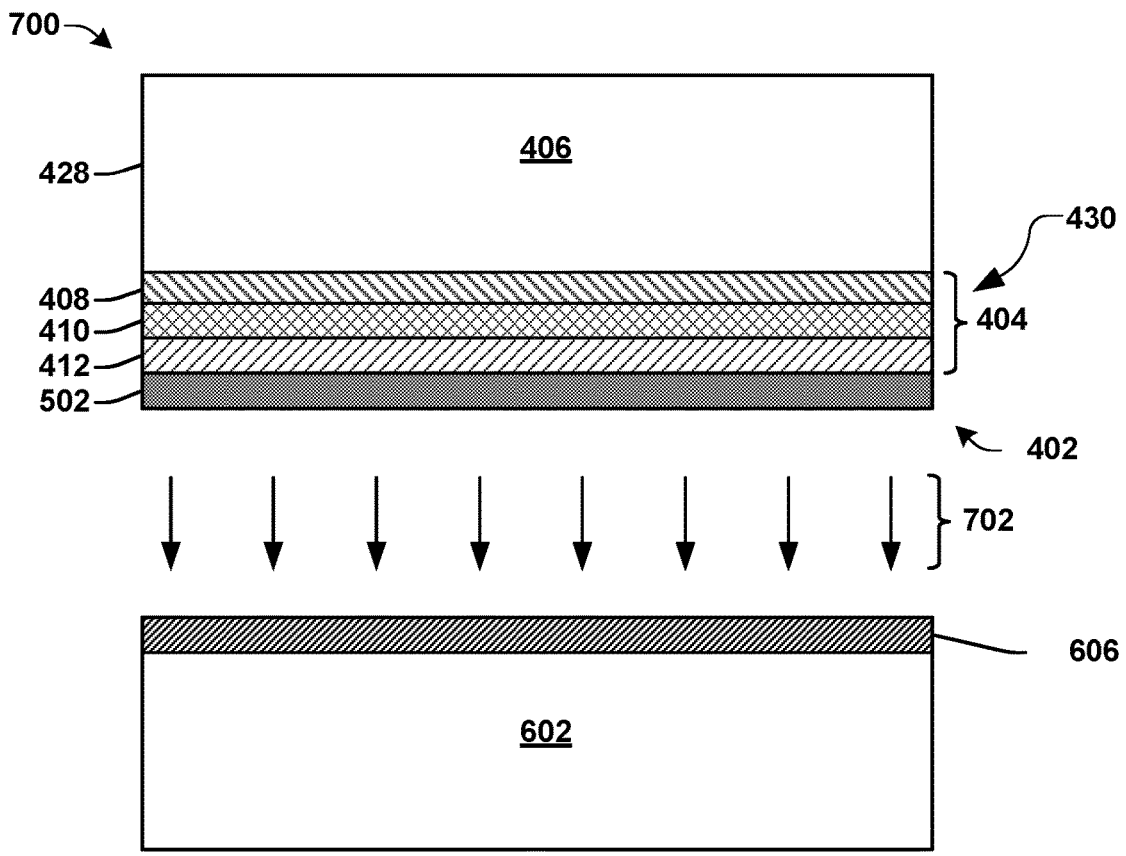

FIG. 6 illustrates a cross-sectional view 700 of some embodiments of a bonding process (e.g., illustrated by arrows 702) of the adhesive layer 606 to the release layer 502 corresponding to act 210 of FIG. 2. As shown in the example cross-sectional view 700 of FIG. 6, the device substrate 402 is inverted with respect to the transparent carrier substrate 602 and bonded thereto. The bonding process 702, for example, is accomplished by a force of less than approximately 50 KN at a dwell temperature of between 50 C and 400 C for less than approximately 60 hours.

Figure 7:
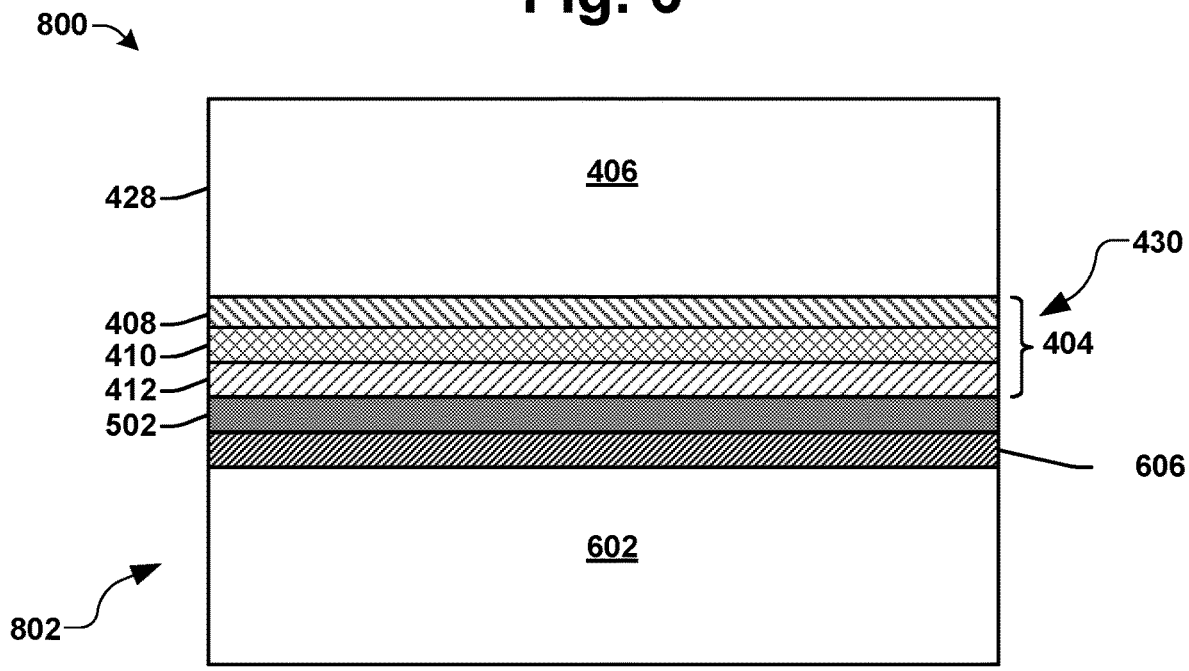

FIG. 7 illustrates a cross-sectional view 800 of some embodiments of a result of performing act 210 of FIG. 2, wherein a composite substrate 802 is thereby defined.

Figure 8:
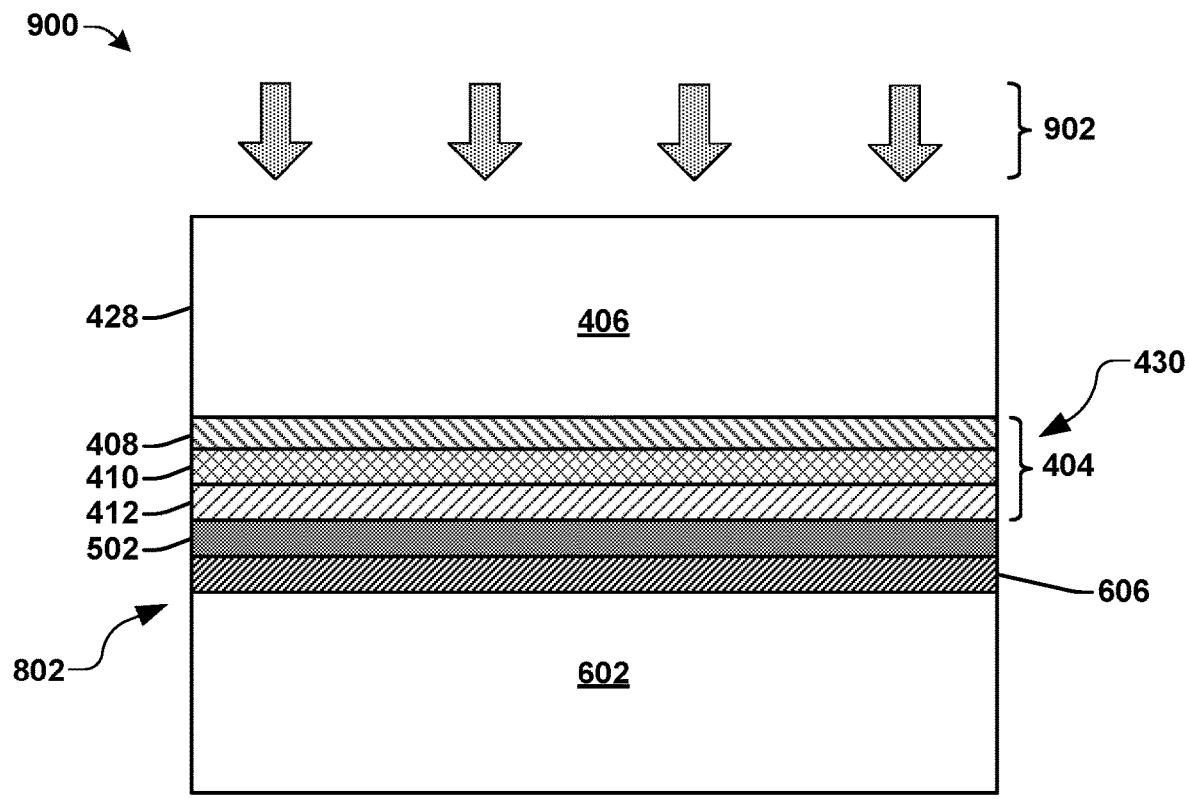

FIG. 8 illustrates a cross-sectional view 900 of some embodiments of the removing the base device layer corresponding to act 212 of FIG. 2. As shown in the cross-sectional view 900 of FIG. 8, the base device layer 406 is removed from the composite substrate. For example, in accordance with one embodiment of the present disclosure, the base device layer is removed from the composite substrate by one or more of an etching operation, such as a wet etch and dry etch, and a grinding operation. Other methods for removing the base device layer from the composite substrate are also contemplated, such as a reactive ion etching or other removal techniques.

Figure 9:
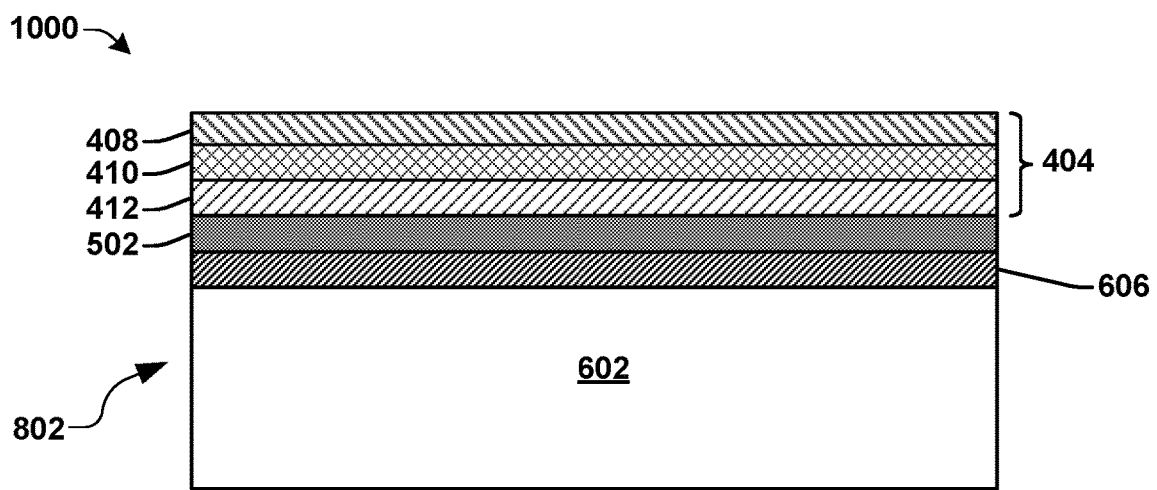

FIG. 9 illustrates a cross-sectional view 1000 of some embodiments of the result of removing the base device layer corresponding to act 212 of FIG. 2.

Figure 10:
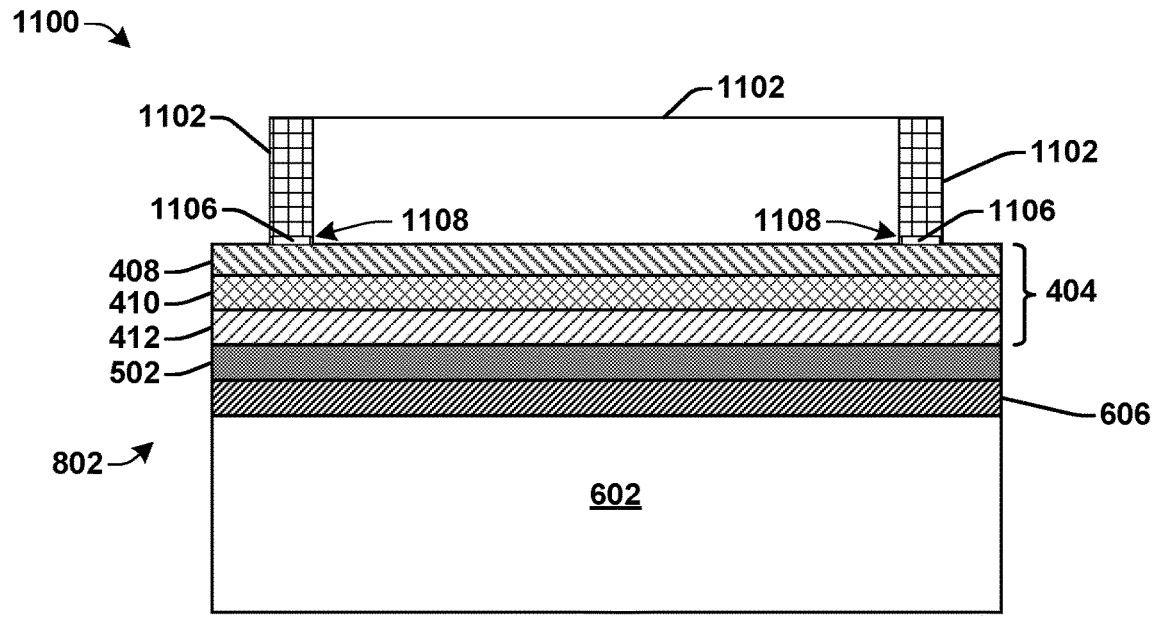

FIG. 10 illustrates a cross-sectional view 1100 of some embodiments of the composite substrate 802 corresponding to act 214 of FIG. 2. As shown in cross-sectional view 1100 of FIG. 10, a pellicle frame 1102 (e.g., a metal frame) is attached to an outermost one of the one or more pellicle layers 404, which in the present example, is the first pellicle layer 408. The pellicle frame 1102, for example, is edge glued via an adhesive 1106 applied to outer edges 1108 of the pellicle frame.

Figure 11:
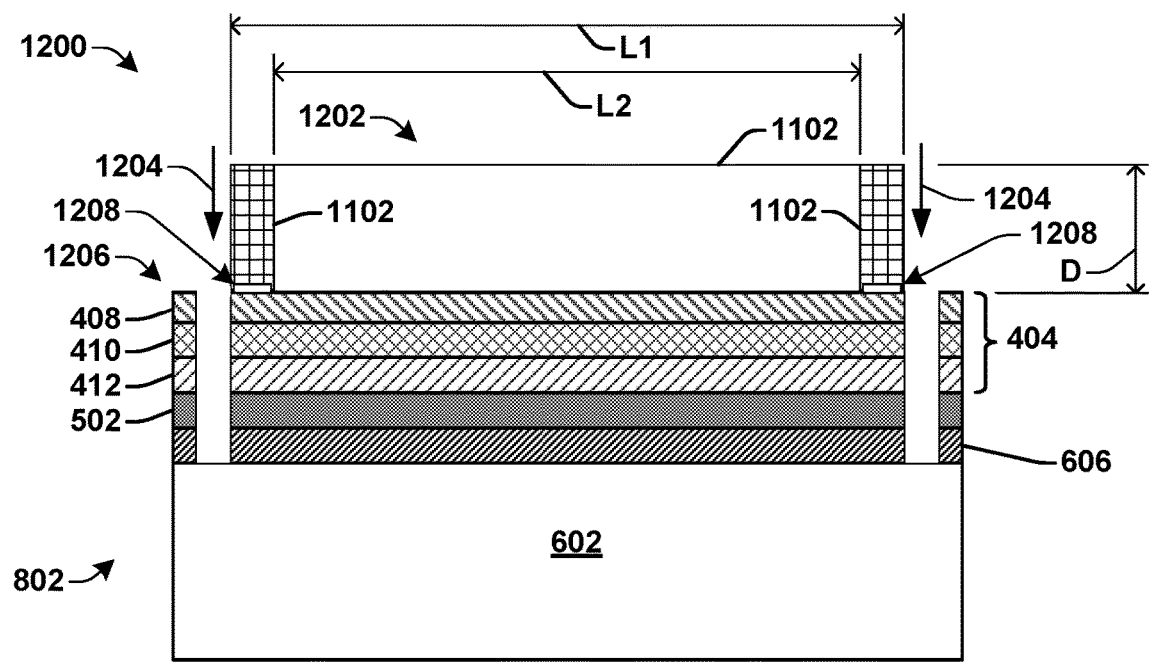

FIG. 11 illustrates a cross-sectional view 1200 of some embodiments of according to act 216 of FIG. 2. As shown in cross-sectional view 1200 of FIG. 11, a pellicle region 1202 is isolated (e.g., laterally separated by singulation shown by arrows 1204) from a remainder 1206 of the composite substrate 802, wherein the pellicle region 1202 is associated with an outer perimeter 1208 (e.g., an outer edge) of the pellicle frame 1102. For example, a size of the pellicle frame 1102 is generally defined by a depth D and a first length L1 and second length L2 having relative dimensions, such as:

$$L1 \geq L2 + 0.5(L1 - L2) \qquad (1).$$

According to various embodiments, the pellicle region 1202 is isolated from the remainder 1206 of the composite substrate 802, for example, by one or more of laser dicing, mechanical dicing and a grind operation. In one example, the pellicle region 1202 is isolated from the remainder 1206 of the composite substrate 802 at the second length L2, while in other examples, the pellicle region 1202 is slightly larger than the second length L2. The pellicle frame 1102, for example, may be substantially uniform and comprised of any substantially rigid material (e.g., various metals, composites, silicon-based and/or carbon-based materials), and the depth D may be sized to provide adequate rigidity and/or to accommodate various other features associated with lithographic processing. Further, the pellicle frame 1102 may be mounted to the outermost one of the one or more pellicle layers 404 prior to, or after the pellicle region 1202 is isolated from the remainder 1206 of the composite substrate 802.

Figure 12:
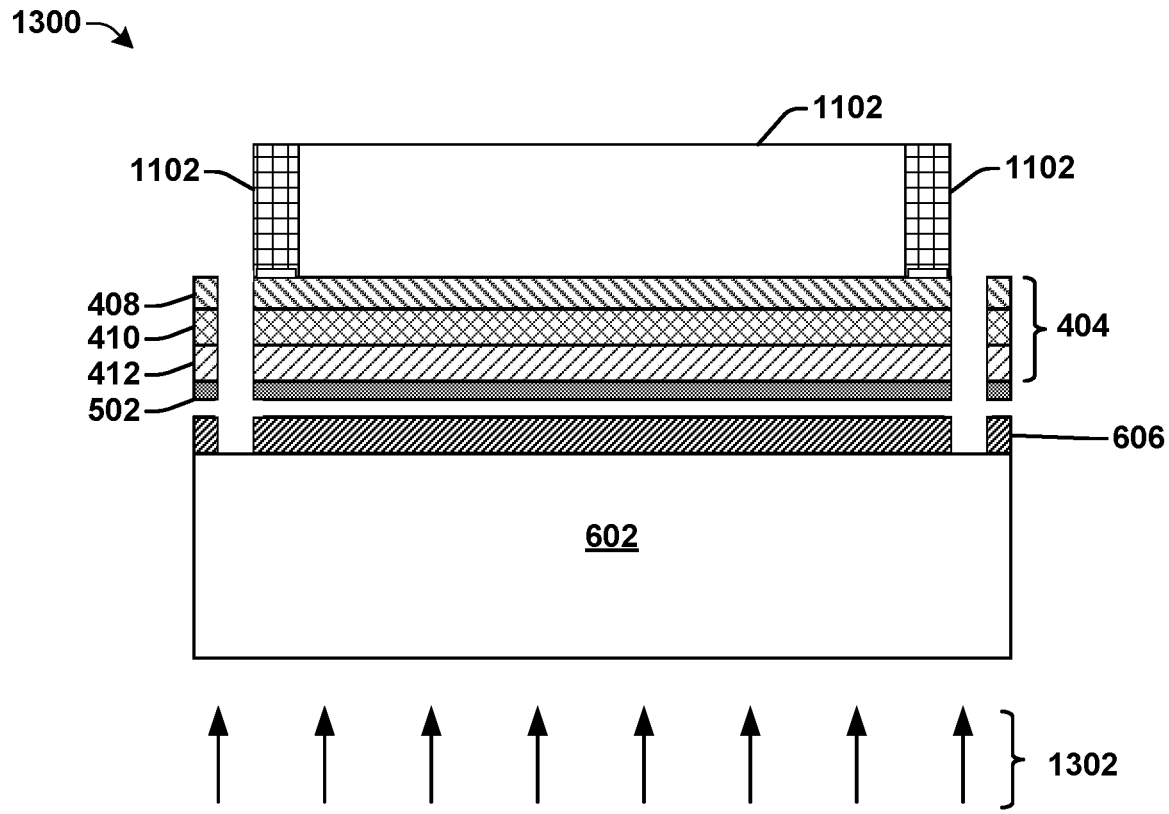
Figure 13:
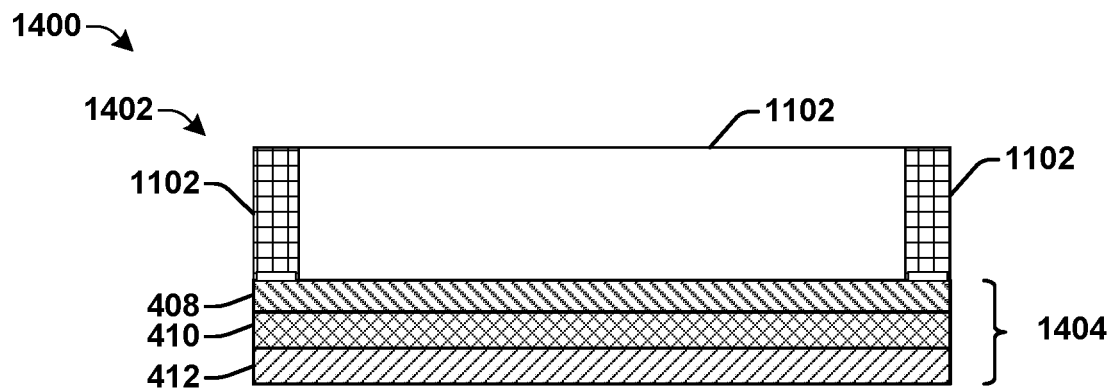

FIG. 12 illustrates a cross-sectional view 1300 of some embodiments of according to act 218 of FIG. 2. As shown in cross-sectional view 1300 of FIG. 12, an ablation process (e.g., shown by arrows 1302) is performed on the release layer 502 through the transparent carrier substrate 602. FIG. 13 illustrates a cross-sectional view 1400 of some embodiments of according to a result of performing act 218 of FIG. 2. As illustrated in FIG. 13, the release layer 502 is fully removed, thus defining a pellicle apparatus 1402 comprising a pellicle film 1404 attached to the pellicle frame 1102. The pellicle frame 1102 of the pellicle apparatus 1402 of FIG. 13, for example, may be further mounted over or operably coupled to the extreme ultraviolet reticle 114 of FIG. 1 to generally enclose and protect the pattern 118 associated with the extreme ultraviolet reticle, as discussed above.

Figure 14:
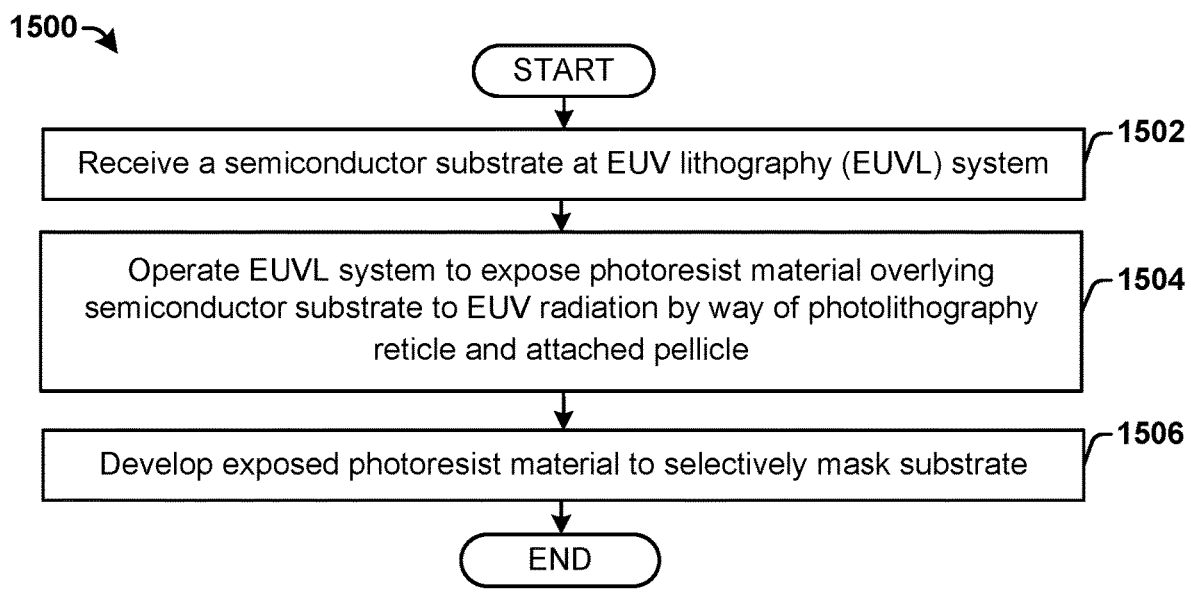
FIG. 14 illustrates a flow diagram of exposing a workpiece to extreme ultraviolet radiation according various embodiments of the present disclosure.

FIG. 14 is a flow diagram of some embodiments of a method 1500 for forming an integrated chip feature on a substrate using an extreme ultraviolet reticle having a pellicle in accordance with various aspects of the present disclosure.

At act 1502, a semiconductor substrate is received at an extreme ultraviolet lithography (EUVL) system, such as the extreme ultraviolet lithography system 100 of FIG. 1. The semiconductor substrate may comprise any type of semiconductor body (e.g., silicon, silicon-germanium, silicon-on-insulator) such as a semiconductor wafer and/or one or more die on a wafer, as well as any other type of semiconductor and/or epitaxial layers associated therewith.

At act 1504 of FIG. 14, the extreme ultraviolet lithography tool is operated to expose the semiconductor substrate to extreme ultraviolet radiation (e.g., having a wavelength of approximately 13.5 nm) by way of an extreme ultraviolet reticle connected to an extreme ultraviolet pellicle, such as via the pellicle apparatus 1402 of FIG. 13.

At act 1506 of FIG. 14, for example, the exposed photoresist material is developed. Developing the selectively exposed photoresist material removes weaker sections of the exposed photoresist material, so as to selectively expose the substrate.

Accordingly, the present disclosure relates to a system, apparatus, and method of forming an extreme ultraviolet (EUV) pellicle comprising a high quality, optically transmissive pellicle film connected to a pellicle frame without a supportive mesh, and an associated apparatus and system.

In some embodiments, the present disclosure relates to an extreme ultraviolet (EUV) pellicle apparatus, wherein the EUV pellicle apparatus comprises a composite structure having a thickness of less than approximately 500 nanometers. The composite structure comprises first pellicle layer having a first surface and a second surface, and a second pellicle layer having a third surface and a fourth surface, wherein the third surface interfaces with the second surface of the first pellicle layer. The composite structure further comprises a third pellicle layer having a fifth surface and a sixth surface, wherein the fifth surface interfaces with the fourth surface of the second pellicle layer. A pellicle frame is further connected to outer edges of a first surface of the first pellicle layer and configured to mount the composite structure to an extreme ultraviolet (EUV) reticle, wherein the first surface and the sixth surface face opposite directions.

According to some embodiments, the first pellicle layer comprises silicon nitride and has a thickness of approximately 20 nanometers or less. In some embodiments, the second pellicle layer comprises polysilicon and has a thickness of approximately 20 nanometers or less. Further, in some embodiments, the third pellicle layer comprises ruthenium and has a thickness of approximately 8 nanometers or less. In some embodiments, an adhesive material is disposed between the outer edges of the first surface of the first pellicle layer and the pellicle frame and configured to connect the pellicle frame to the composite structure.

According to another embodiment, a method for forming a pellicle apparatus is provided, wherein a device substrate is provided having a one or more pellicle layers defined over a base device layer. A release layer is formed over the one or more pellicle layers, and a transparent carrier substrate is further provided. An adhesive layer is formed over the transparent carrier substrate, and the adhesive layer is bonded to the release layer, therein defining a composite substrate comprised of the device substrate and carrier substrate. The base device layer, for example, is removed from the composite substrate, and a pellicle frame is attached to an outermost surface of the one or more pellicle layers. A pellicle region is further isolated from a remainder of the composite substrate, wherein the pellicle region is associated with an outer perimeter of the pellicle frame. An ablation of the release layer is further performed through the transparent carrier substrate, therein defining the pellicle apparatus comprising a pellicle film attached to the pellicle frame, and the pellicle apparatus is separated from a remaining portion of the composite substrate.

In some embodiments, the carrier substrate is less than approximately 250 microns in thickness and comprises a material having greater than 90% transmittance in wavelengths ranging from 100 nm to 500 nm. The release layer may comprise a laser release layer, wherein performing the ablation of the release layer comprises subjecting the laser release layer to laser light. In some embodiments, providing the device substrate comprises performing a chemical vapor deposition of the one or more pellicle layers over a silicon substrate.

In some embodiments, the one or more pellicle layers comprise a ruthenium layer having a first surface and a second surface, a polysilicon layer having a third surface and a fourth surface, wherein the third surface interfaces with the second surface of the ruthenium layer, and a silicon nitride layer having a fifth surface and a sixth surface, wherein the fifth surface interfaces with the fourth surface of the polysilicon layer, wherein the pellicle frame is mounted to the sixth surface. Removing the base device layer from the composite substrate, for example, may comprise one or more of an etching operation and a grinding operation. Isolating the pellicle region from a remainder of the composite substrate, for example, may comprise one or more of a mechanical dicing and laser dicing of the composite substrate.

In still other embodiments, an extreme ultraviolet (EUV) lithography system is provided. The EUV lithography system comprises an EUV radiation source and a lithographic reticle having a pattern formed thereon. A target apparatus is configured to support a target substrate, wherein the EUV radiation source, lithographic reticle, and target apparatus are arranged such that EUV radiation source is configured to expose the target substrate with an image associated with the pattern on the lithographic reticle. Further, a pellicle apparatus as described above is provided and configured to protect the lithographic reticle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) pellicle apparatus, comprising:
    a composite structure having a thickness of less than approximately 500 nanometers, the composite structure comprising:
        a first pellicle layer having a first surface and a second surface;
        a second pellicle layer having a third surface and a fourth surface, wherein the third surface interfaces with the second surface of the first pellicle layer, and wherein the second pellicle layer comprises polysilicon; and
        a third pellicle layer having a fifth surface and a sixth surface, wherein the fifth surface interfaces with the fourth surface of the second pellicle layer; and
    a pellicle frame connected to outer edges of the first surface of the first pellicle layer and configured to mount the composite structure to an extreme ultraviolet (EUV) reticle, wherein the first surface and the sixth surface face opposite directions.

2. The EUV pellicle apparatus of claim 1, wherein the first pellicle layer comprises silicon nitride.

3. The EUV pellicle apparatus of claim 2, wherein the first pellicle layer has a thickness of approximately 20 nanometers or less.

4. The EUV pellicle apparatus of claim 1, wherein the second pellicle layer has a thickness of approximately 20 nanometers or less.

5. The EUV pellicle apparatus of claim 1, wherein the third pellicle layer comprises ruthenium.

6. The EUV pellicle apparatus of claim 5, wherein the third pellicle layer has a thickness of approximately 8 nanometers or less.

7. The EUV pellicle apparatus of claim 1, further comprising an adhesive material disposed between the outer edges of the first surface of the first pellicle layer and the pellicle frame and configured to connect the pellicle frame to the composite structure.

8. A method for forming a pellicle apparatus, the method comprising:
    providing a device substrate having one or more pellicle layers defined over a base device layer;
    forming a release layer over the one or more pellicle layers;
    providing a transparent carrier substrate;
    forming an adhesive layer over the transparent carrier substrate;
    bonding the adhesive layer to the release layer, therein defining a composite substrate comprised of the device substrate and carrier substrate;
    removing the base device layer from the composite substrate;
    attaching a pellicle frame to an outermost surface of the one or more pellicle layers;
    isolating a pellicle region from a remainder of the composite substrate, wherein the pellicle region is associated with an outer perimeter of the pellicle frame;
    performing an ablation of the release layer through the transparent carrier substrate, therein defining the pellicle apparatus comprising a pellicle film attached to the pellicle frame; and
    separating the pellicle apparatus from a remaining portion of the composite substrate.

9. The method of claim 8, wherein the carrier substrate is less than approximately 250 microns in thickness and comprises a material having greater than 90% transmittance in wavelengths ranging from 100 nm to 500 nm.

10. The method of claim 9, wherein the release layer comprises a laser release layer, and wherein performing the ablation of the release layer comprises subjecting the laser release layer to laser light.

11. The method of claim 8, wherein providing the device substrate comprises performing a chemical vapor deposition of the one or more pellicle layers over a silicon substrate.

12. The method of claim 11, wherein the one or more pellicle layers comprise:
    a ruthenium layer having a first surface and a second surface;
    a polysilicon layer having a third surface and a fourth surface, wherein the third surface interfaces with the second surface of the ruthenium layer; and
    a silicon nitride layer having a fifth surface and a sixth surface, wherein the fifth surface interfaces with the fourth surface of the polysilicon layer, wherein the pellicle frame is mounted to the sixth surface.

13. The method of claim 8, wherein removing the base device layer from the composite substrate comprises one or more of an etching operation and a grinding operation.

14. The method of claim 8, wherein isolating the pellicle region from a remainder of the composite substrate comprises one or more of a mechanical dicing and laser dicing of the composite substrate.

15. An extreme ultraviolet (EUV) lithography system, comprising:
    an EUV radiation source;
    a lithographic reticle having a pattern formed thereon;
    a target apparatus configured to support a target substrate, wherein the EUV radiation source, lithographic reticle, and target apparatus are arranged such that EUV radiation source is configured to expose the target substrate with an image associated with the pattern on the lithographic reticle; and
    a pellicle apparatus configured to protect the lithographic reticle, the pellicle apparatus comprising:
        a composite structure comprising:
            a first pellicle layer having a first surface and a second surface;
            a second pellicle layer having a third surface and a fourth surface, wherein the third surface interfaces with the second surface of the first pellicle layer; and a third pellicle layer having a fifth surface and a sixth surface, wherein the fifth surface interfaces with the fourth surface of the second pellicle layer, and wherein the first pellicle layer comprises ruthenium, the second pellicle layer comprises polysilicon, and the third pellicle layer comprises silicon nitride; and a pellicle frame connected to outer edges of the first surface of the first pellicle layer and configured to mount the composite structure to an extreme ultraviolet (EUV) reticle, wherein the first surface and the sixth surface face opposite directions.

16. The EUV lithography system of claim 15, wherein the first pellicle layer has a thickness of approximately 8 nanometers or less, and where each of the second pellicle layer and third pellicle layer has a respective thickness of approximately 20 nanometers or less.

17. The EUV lithography system of claim 15, wherein the composite structure has a thickness of less than approximately 500 nanometers.

18. The EUV lithography system of claim 15, wherein the EUV radiation source is configured to transmit radiation.

* * * * *